(12) United States Patent
Azadet et al.

(10) Patent No.: US 11,038,516 B1
(45) Date of Patent: Jun. 15, 2021

(54) APPARATUS AND METHOD FOR ANALOG-TO-DIGITAL CONVERSION

(71) Applicant: Intel Corporation, Santa Clara, CA (US)

(72) Inventors: Kameran Azadet, San Ramon, CA (US); Ramon Sanchez, Galapagar MD (ES); Albert Molina, Novelda (ES); Martin Clara, Santa Clara, CA (US); Daniel Gruber, St. Andrae (AT); Matteo Camponeschi, Villach (AT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/886,817

(22) Filed: May 29, 2020

(51) Int. Cl.
*H03M 1/10* (2006.01)
*H03M 1/34* (2006.01)
*H03M 1/06* (2006.01)

(52) U.S. Cl.
CPC ....... *H03M 1/1009* (2013.01); *H03M 1/0658* (2013.01); *H03M 1/34* (2013.01)

(58) Field of Classification Search
CPC ..... H03M 1/1009; H03M 1/0658; H03M 1/34
USPC .................................................. 341/120–155
See application file for complete search history.

(56) References Cited

U.S. PATENT DOCUMENTS

| | | | | |
|---|---|---|---|---|
| 4,482,861 A * | 11/1984 | Jalovec | ................. | G01R 23/18 324/121 R |
| 5,408,233 A * | 4/1995 | Gannon | ................. | G06J 1/00 341/131 |
| 5,525,984 A * | 6/1996 | Bunker | ................. | H03M 1/0641 341/131 |
| 10,833,693 B2 * | 11/2020 | Bjork | ................. | H03M 1/1038 |
| 2004/0263367 A1 * | 12/2004 | Batruni | ................. | H03M 1/0614 341/120 |
| 2006/0176197 A1 * | 8/2006 | McNeill | ................. | H03M 1/1004 341/120 |
| 2011/0199096 A1 * | 8/2011 | Kidambi | ................. | H03M 1/1042 324/615 |
| 2013/0241755 A1 * | 9/2013 | Chen | ................. | H03M 1/1009 341/120 |

(Continued)

OTHER PUBLICATIONS

Sunghyuk Lee et al.: "A 1 GS/s 10b 18.9 mW Time-Interleaved SAR ADC With Background Timing Skew Calibration"; IEEE Journal of Solid-State Circuits, vol. 49; No. 12, Dec. 2014.

*Primary Examiner* — Lam T Mai
(74) *Attorney, Agent, or Firm* — 2SPL Patent Attorneys PartG mbB; Yong Beom Hwang (57) ABSTRACT

An apparatus and method for analog-to-digital conversion. The apparatus includes a first analog-to-digital converter (ADC), a second ADC, and a calibration unit. The first ADC is configured to sample an input analog signal at a first sampling frequency. The second ADC is configured to sample the input analog signal at a second sampling frequency. The second sampling frequency is a fraction of the first sampling frequency. The calibration unit is configured to correct a distortion incurred in an output of the first ADC based on an output of the second ADC. The first ADC may be a time-interleaved ADC. The second ADC may be an extra sub-ADC of the time-interleaved ADC. The second ADC may be configured to sample the input analog signal at random sampling phases. A dithering noise may be added to the input analog signal of the second ADC. The calibration unit may be a non-linear equalizer.

17 Claims, 8 Drawing Sheets

(56) References Cited

U.S. PATENT DOCUMENTS

2016/0373128 A1* 12/2016 Wang ...................... H03M 1/46
2018/0138919 A1* 5/2018 Bjork .................. H03M 1/1004

* cited by examiner

APPARATUS AND METHOD FOR ANALOG-TO-DIGITAL CONVERSION

FIELD

Examples relate to analog-to-digital conversion, more particularly a method and apparatus for calibrating a high-speed analog-to-digital converter (ADC) using a sub-sampled observation ADC.

BACKGROUND

Correction of non-idealities in a multi-giga-samples-per-second ADC is an extremely challenging problem. Conventionally, blind methods are used for direct current (DC) or gain mismatch correction or analog timing skew correction for a time-interleaved ADC which is preceded by a wideband input buffer. However, no correction has been performed for correction due to buffer non-linearities. This leads to limited spurious-free dynamic range (SFDR) performance, which gets even worse at higher radio frequency (RF) frequencies.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Examples are disclosed for an apparatus for analog-to-digital conversion having an observation ADC for calibration of a main high-speed ADC. Examples provide a robust solution to train a correction/calibration circuit (e.g. a digital signal processor (DSP)-based correction/calibration circuit) of an RF ADC where inputs are unknown a priori.

Correction of an output of an RF ADC (e.g. a time-interleaved high-speed ADC) is very difficult because the input signal is not known a priori. In order to adapt the calibration circuit (e.g. a receiver non-linear equalizer), the examples may use an auxiliary sub-sampling observation ADC with a random phase. In accordance with examples disclosed herein, the input signal itself is used as a reference signal for correction of an output of an RF ADC. Using the input signal itself as a reference for correction/calibration can lead to a substantial performance improvement compared to a broadband random reference signal.

Figure 1:
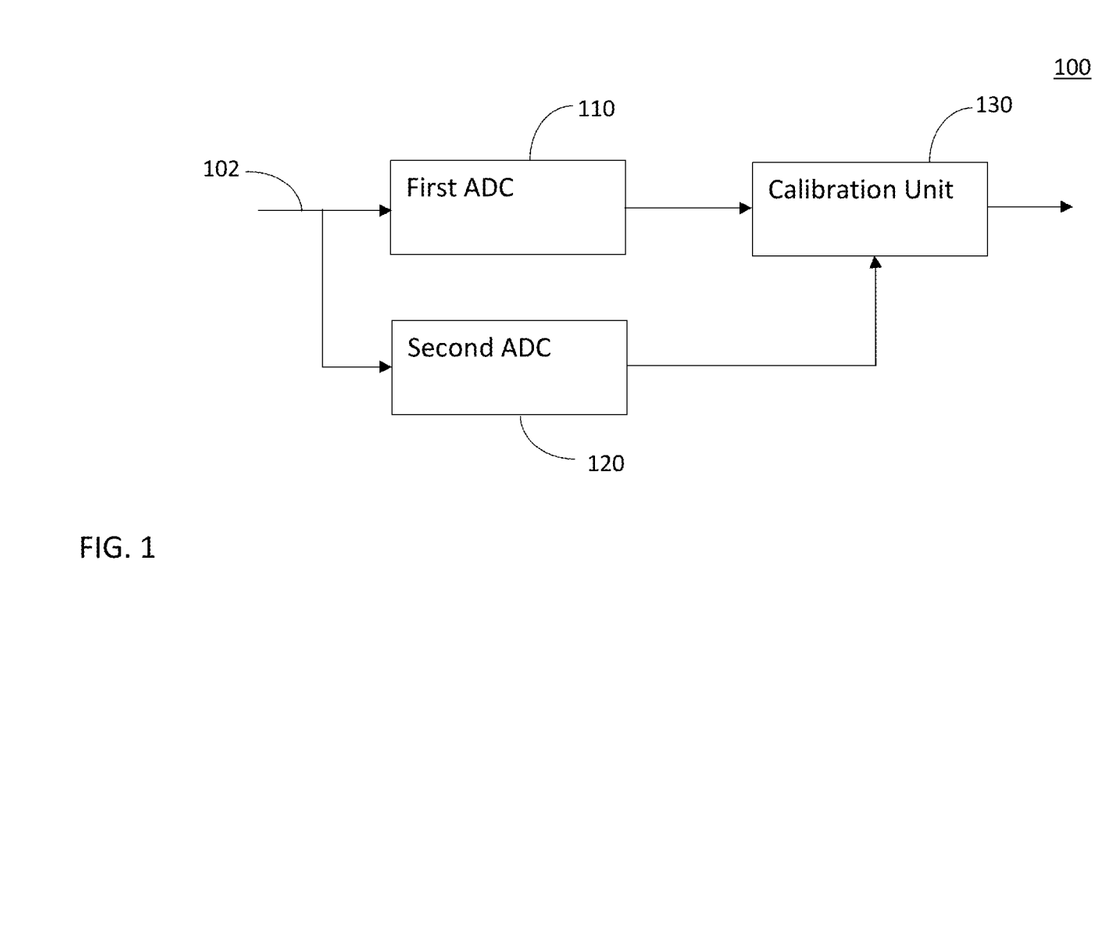
FIG. 1 is a block diagram of an apparatus for analog-to-digital conversion in accordance with one example.

FIG. 1 is a block diagram of an apparatus 100 for analog-to-digital conversion in accordance with one example. The apparatus 100 includes a first ADC 110, a second ADC 120, and a calibration unit 130. The first ADC 110 is a main ADC in a receiver. The first ADC 110 is configured to receive an input analog signal 102 and sample the input analog signal 102 at a first sampling frequency to convert the input analog signal 102 to a digital signal. The first ADC 110 is a high-speed ADC running at a high sampling frequency, e.g. multi-giga samples per second.

The second ADC 120 is an auxiliary ADC. The second ADC 120 is an observation ADC provided for generating a reference signal for calibrating an output of the first ADC 110. The second ADC 120 is configured to receive the input analog signal 102 and sample the input analog signal 102 at a second sampling frequency. The second sampling frequency is lower than the first sampling frequency, i.e. the second ADC is a sub-sampling ADC. The second sampling frequency is a fraction of the first sampling frequency. In some examples, the second ADC 120 may sample the input analog signal 102 at random sampling phases, which will be explained in detail below.

The first ADC 110 and the second ADC 120 may be any type of conventional ADCs. In some examples, the first ADC 110 may be a time-interleaved ADC having a plurality of sub-ADCs. The second ADC 120 may be a separate/independent ADC. Alternatively, the second ADC 120 may be a sub-ADC (e.g., an extra sub-ADC) of the time-interleaved ADC which is used as the first ADC 110.

The calibration unit 130 is configured to correct a distortion incurred in an output of the first ADC 110 based on an output of the second ADC 120. The calibration unit 130 uses the sub-sampled outputs from the second ADC 120 as a reference for calibrating the output of the first ADC 110. The distortion is incurred due to non-linear effects caused by the first ADC 110 and/or a buffer (now shown in FIG. 1) preceding the first ADC 110. The distortion may be caused by at least one of static mismatch of normally equal circuit elements, gain mismatch, sampling timing skew, frequency response mismatch, frequency response flatness, buffer non-linearity, sampler non-linearity, sampler non-linearity mismatch, or the like.

In one example, the calibration unit 130 may be a non-linear equalizer configured to correct the distortion. The calibration unit 130 may adapt the parameters for the non-linear equalizer using a least square (LS) or least mean square (LMS) algorithm based on a difference between an output of the non-linear equalizer and the output of the second ADC 120. The output of the second ADC 120 is used as a reference for correcting the output of the first ADC 110.

The apparatus 100 may further include a buffer for buffering the input analog signal 102 before supplying the input analog signal 102 to the second ADC 120. The apparatus 100 may include an attenuator for attenuating a power of the input analog signal at an input of the buffer. By attenuating the input analog signal 102 to a proper level, the linearity of the buffer may be improved, and the buffer's linearity requirement may be relaxed.

In some examples, a dithering noise may be added to the input analog signal 102 supplied to the second ADC 120. The additive dithering noise may suppress quantization spurs in the output of the second ADC 120. By adding the dithering noise, the SFDR may be improved. The dithering noise may not be subtracted or cancelled at the output of the second ADC 120 since the second ADC 120 has a relaxed noise requirement and a noise can be cancelled out by integrating over long period of time. Alternatively, in some examples, the dithering noise may be subtracted from an output of the second ADC 120 in a digital domain.

Figure 2:
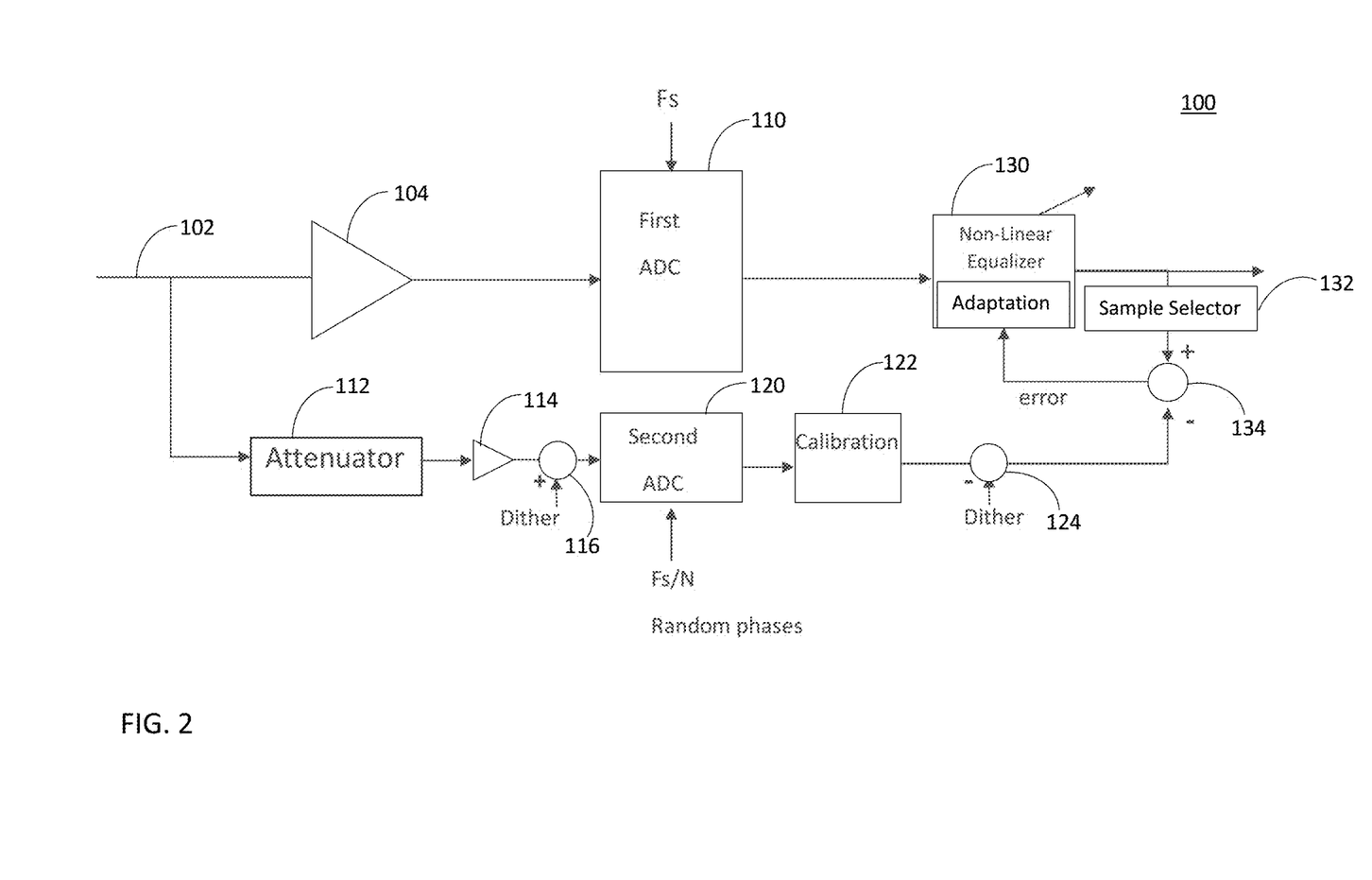
FIG. 2 is a more-detailed block diagram of an apparatus for analog-to-digital conversion in accordance with one example.

FIG. 2 is a block diagram of an apparatus 100 for analog-to-digital conversion in accordance with one example. The apparatus 100 includes a first ADC 110, a second ADC 120, and a calibration unit 130 (e.g. a non-linear equalizer). The first ADC 110 is a main ADC in a receiver. The first ADC 110 receives an input analog signal 102 and samples the input analog signal 102 at a first sampling frequency (Fs) to covert the input analog signal 102 to a digital domain. The first ADC 110 is a high-speed ADC running at a high sampling frequency, e.g. multi-giga samples per second. The output of the first ADC 110 may be a very wideband signal.

The input analog signal 102 may be supplied to the first ADC 110 via a buffer 104 (analog input buffer). A buffer 104 is a unity gain amplifier to deliver the same or nearly the same voltage and current it sees at its input to its output.

The first ADC 110 may be any type of conventional ADCs. In one example, the first ADC 110 may be a time-interleaved ADC. A time-interleaved ADC includes a plurality of sub-ADCs coupled in parallel. Time-interleaving of the sub-ADCs is a way to increase the overall system sampling rate by using several ADCs in parallel. An M-channel time-interleaved ADC that includes M sub-ADCs coupled in parallel increases the sampling rate by a factor of M.

The challenge with the time-interleaved ADC is to handle the mismatch among the sub-ADCs, especially at higher frequencies. A time-interleaved ADC has multiple matching problems that cause distortions in the sampled signal. The distortions may be caused by static mismatch of normally equal circuit elements, gain mismatch, time skew, frequency response mismatch, frequency response flatness, sampler non-linearity, and non-linearity mismatch, etc. The buffer 104 is also a non-linear device and the buffer non-linearity may also cause a distortion in the sampled data.

The second ADC 120 also receives the input analog signal 102 and samples the input analog signal 102 at a second sampling frequency. The second ADC 120 is an observation ADC provided for calibration of the first ADC 110, i.e. for generating a reference signal for calibration of the first ADC 110. The second ADC 120 is a sub-sampling ADC. The second ADC 120 samples the input analog signal 102 at a fraction of the sampling frequency of the first ADC 110. The sampling frequency of the second ADC 120 may be expressed as Fs/N where Fs is an overall system sampling frequency of the first ADC 110 and N is a sub-sampling factor.

The second ADC 120 may be any type of conventional ADCs. The second ADC 120 may be an independent and separate ADC. Alternatively, if the first ADC 110 is a time-interleaved ADC, the second ADC 120 may be a sub-ADC (e.g. an extra sub-ADC) of the time-interleaved ADC. Although the second ADC 120 (auxiliary ADC) operates at N times lower rate than the first ADC 110 (main RX ADC), the sampling instants should be accurate since the input signal 102 may be an extremely fast RF signal. In order to lower a design effort, one of the sub-ADCs or a slightly modified version of the sub-ADC of the time-interleaved ADC may be used to implement the second ADC 120.

In order to obtain a very good linearity from the second ADC 120 (e.g. the extra additional sub-ADC of the time-interleaved ADC), an input attenuator 112 may be used at the input of the second ADC 120. If a buffer 114 (an analog input buffer) is used at an input of the second ADC 120, the attenuation by the attenuator 112 may be performed at the input of the buffer 114. Too little attenuation may result in distortion in the output of the second ADC 120 due to distortion caused by the input buffer 114. Too much attenuation may cause quantization spurs in the ADC output and may result in lower SFDR in the quantizer (in the second ADC 120). Quantization spurs are spectral spurs due to quantization in an ADC. Therefore, by properly attenuating the input analog signal 102 by the attenuator 112, a more linear output may be obtained from the second ADC 120. An optimum level of attenuation by the attenuator 112 may be determined for a more linear output of the second ADC 120, (e.g. 10 dB, 12 dB, etc.) To achieve acceptable linearity, the buffer 114 may be made as linear as possible by analog means but this may lead to excessive power consumption. By attenuating the input signal 102 by the attenuator 112, the linearity requirement of the buffer 114 may be relaxed to save power consumption.

When calibration is performed, the observation receive chain including the second ADC 120, the buffer 114, etc. is used. In some examples, when calibration is not performed, the second ADC 120, the buffer 114, the attenuator 112, etc. in the observation receive chain may be powered down to reduce power consumption.

The output of the second ADC 120 may be calibrated by the observing ADC calibration unit 122. For example, the observing ADC calibration unit 122 may correct the integral non-linearity and quantization noise of the second ADC 120 based on a look-up table. A delay or a gain of the output of the second ADC 120 may also be adjusted by the observing ADC calibration unit 122.

The calibration unit 130 corrects a distortion incurred in an output of the first ADC 110 based on an output of the second ADC 120. The distortion is incurred due to the non-linear effects caused by the first ADC 110 and/or the buffer 104 preceding the first ADC 110. The distortion may be caused by at least one of static mismatch of normally equal circuit elements, gain mismatch, timing skew, frequency response mismatch, frequency response flatness, buffer non-linearity, sampler non-linearity, sampler non-linearity mismatch, or the like. The calibration unit 130 uses the output of the second ADC 120 (i.e. sub-sampled output) as a reference for non-linearity compensation/calibration in the output of the first ADC 110.

In one example, the calibration unit 130 may be a non-linear equalizer (NLEQ). A non-linear equalizer generates an output as a non-linear combination of scaled and delayed versions of the input. The non-linear equalizer may remove or reduce the distortion caused by the non-linearities of the preceding circuitries such as the buffer 104 and the first ADC 110 and mismatches due to time-interleaving of the sub-ADCs in the time-interleaved ADC (i.e. the first ADC 110). The output of the second ADC 120 is subtracted from the output of the calibration unit 130 by a subtractor 134, and the calibration unit 130 may adapt the parameters for the non-linear equalization based on the difference (i.e. the error) between an output of the non-linear equalizer (i.e. the calibration unit 130) and the output of the second ADC 120. For example, the calibration unit 130 may adapt the parameters for the non-linear calibration using a lease square (LS) or least mean square (LMS) algorithm or any other adaptation algorithm.

Since the second ADC 120 samples the input analog signal 102 at a fraction of the sampling frequency of the first ADC 110, in some examples, the sampling phase of the second ADC 120 may be randomized in order to ensure a robust operation when the input analog signal is periodic.

Figure 3:
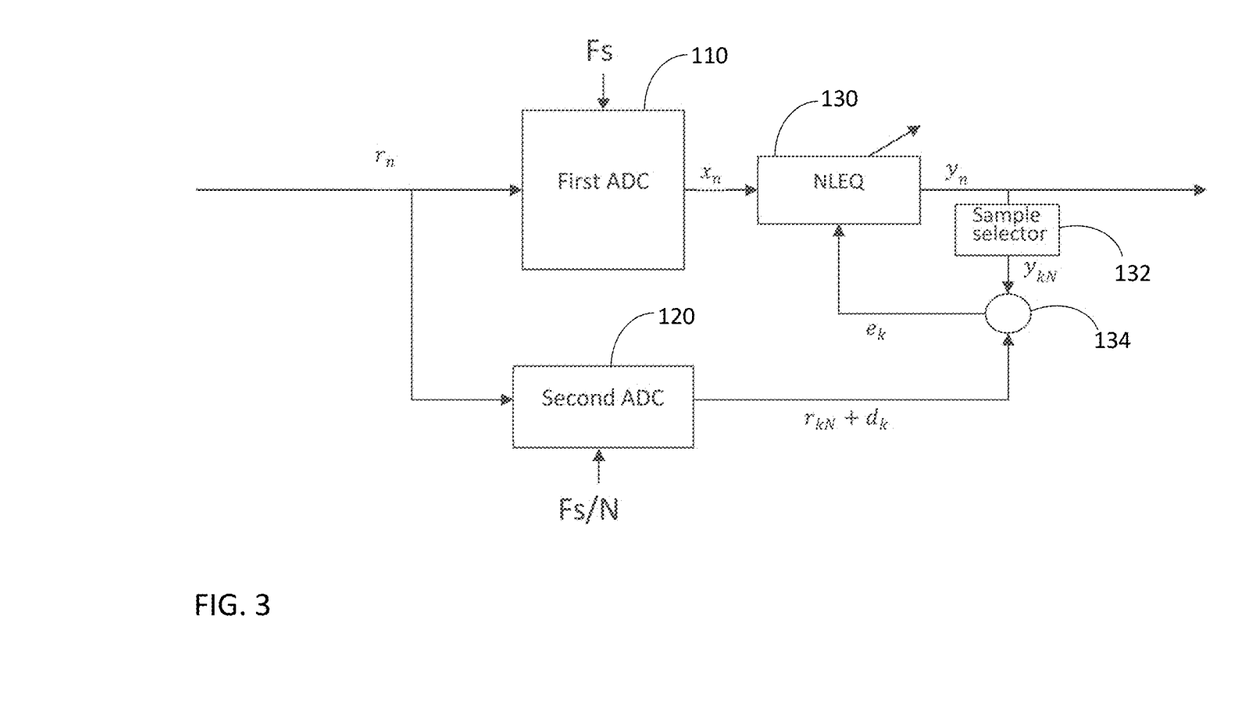
FIG. 3 shows an adaptation based on the sub-sampled outputs of the second ADC in accordance with one example.

FIG. 3 shows an adaptation based on the sub-sampled outputs of the second ADC in accordance with one example. The input analog signal 102 is denoted as $r_n$ and the output of the first ADC 110 (e.g. the output of the time-interleaved ADC) is denoted as $x_n$. The output of the calibration unit 130 is denoted as $y_n$. The random-phase output of the second ADC 120 (i.e. the random-phase sub-sampled output of the input analog signal $r_n$) is denoted as $r_{kN}+d_k$, where $d_k$ is a dithering noise. For a time-interleaved ADC, $y_n$ is decimated by N relative to $x_n$ by a sample selector 132.

The calibration unit 130 receives the output $x_n$ of the first ADC 110 and generates an equalized output $y_n$ as a linear and non-linear combination of the scaled and delayed input samples. The output of the calibration unit 130 (e.g. a non-linear equalizer) may be expressed as in Equation (1). It should be noted that this expression is merely an example and any other different model for non-linear equalization may be used.

$$\alpha_{1,0}x_n+\alpha_{1,1}x_{n-1}\alpha_{2,1}x_n^2=y_n. \qquad \text{Equation (1)}$$

A series of output samples from the calibration unit 130 may be expressed as shown below. As an example, a set of decimated ADC outputs by a factor of 4 (i.e. sub-sampled outputs by a factor of 4) are highlighted in bold below:

$$\alpha_{1,0}x_n+\alpha_{1,1}x_{n-1}+\alpha_{2,1}x_n^2=y_n$$

$$\alpha_{1,0}x_{n+1}+\alpha_{1,1}x_n+\alpha_{2,1}x_{n+1}^2=y_{n+1}$$

$$\alpha_{1,0}x_{n+2}+\alpha_{1,1}x_{n+1}+\alpha_{2,1}x_{n+2}^2=y_{n+2}$$

$$\alpha_{1,0}x_{n+3}+\alpha_{1,1}x_{n+2}+\alpha_{2,1}x_{n+3}^2=y_{n+3}$$

$$\alpha_{1,0}x_{n+4}+\alpha_{1,1}x_{n+3}+\alpha_{2,1}x_{n+4}^2=y_{n+4}$$

$$\alpha_{1,0}x_{n+5}+\alpha_{1,1}x_{n+4}+\alpha_{2,1}x_{n+5}^2=y_{n+5}$$

$$\alpha_{1,0}x_{n+6}+\alpha_{1,1}x_{n+5}+\alpha_{2,1}x_{n+6}^2=y_{n+6}$$

$$\alpha_{1,0}x_{n+7}+\alpha_{1,1}x_{n+6}+\alpha_{2,1}x_{n+7}^2=y_{n+7}$$

$$\alpha_{1,0}x_{n+8}+\alpha_{1,1}x_{n+7}+\alpha_{2,1}x_{n+8}^2=y_{n+8}$$

In order to solve Equation (1) and find the three variables (the coefficients $\alpha_{1,1}$, $\alpha_{1,1}$, $\alpha_{2,1}$ in Equation (1) in this example), not all the equations above, but only 3 linearly independent equations are needed (e.g. the highlighted ones above). In case of a periodic input signal (e.g. in case of an input signal having a period of Fs/N or integer multiple of Fs/N), 3 linearly independent equations may not be found if the ADC output is decimated by a factor of 4 with a fixed phase in this example as shown by the bold items below:

$$\alpha_{1,0}x_n+\alpha_{1,1}x_{n-1}+\alpha_{2,1}x_n^2=y_n$$

$$\alpha_{1,0}x_{n+1}+\alpha_{1,1}x_n+\alpha_{2,1}x_{n+1}^2=y_{n+1}$$

$$\alpha_{1,0}x_{n+2}+\alpha_{1,1}x_{n+1}\alpha_{2,1}x_{n+2}^2=y_{n+2}$$

$$\alpha_{1,0}x_{n+3}+\alpha_{1,1}x_{n+2}+\alpha_{2,1}x_{n+3}^2=y_{n+3}$$

$$\alpha_{1,0}x_n+\alpha_{1,1}x_{n-1}+\alpha_{2,1}x_n^2=y_n$$

$$\alpha_{1,0}x_{n+1}+\alpha_{1,1}x_n+\alpha_{2,1}x_{n+1}^2=y_{n+1}$$

$$\alpha_{1,0}x_{n+2}+\alpha_{1,1}x_{n+1}\alpha_{2,1}x_{n+2}^2=y_{n+2}$$

$$\alpha_{1,0}x_{n+3}+\alpha_{1,1}x_{n+2}+\alpha_{2,1}x_{n+3}^2=y_{n+3}$$

$$\alpha_{1,0}x_n+\alpha_{1,1}x_{n-1}+\alpha_{2,1}x_n^2=y_n$$

$$\alpha_{1,0}x_{n+1}+\alpha_{1,1}x_n+\alpha_{2,1}x_{n+1}^2=y_{n+1}$$

In order to solve the problem, in some examples, the sampling phase of the second ADC 120 may be randomized. By the random phase sub-sampling at the second ADC 130 and the corresponding sample selection by the sample selector 132, as shown below as an example, 3 independent equations (the bold items below) may be obtained and the three variables (the coefficients $\alpha_{1,0}$, $\alpha_{1,1}$, $\alpha_{2,1}$ in this example) may be found from the random phase sub-samples.

$$\alpha_{1,0}x_n+\alpha_{1,1}x_{n-1}+\alpha_{2,1}x_n^2=y_n$$

$$\alpha_{1,0}x_{n+1}+\alpha_{1,1}x_n+\alpha_{2,1}x_{n+1}^2=y_{n+1}$$

$$\alpha_{1,0}x_{n+2}+\alpha_{1,1}x_{n+1}\alpha_{2,1}x_{n+2}^2=y_{n+2}$$

$$\alpha_{1,0}x_{n+3}+\alpha_{1,1}x_{n+2}+\alpha_{2,1}x_{n+3}^2=y_{n+3}$$

$$\alpha_{1,0}x_n+\alpha_{1,1}x_{n-1}+\alpha_{2,1}x_n^2=y_n$$

$$\alpha_{1,0}x_{n+1}+\alpha_{1,1}x_n+\alpha_{2,1}x_{n+1}^2=y_{n+1}$$

$$\alpha_{1,0}x_{n+2}+\alpha_{1,1}x_{n+1}\alpha_{2,1}x_{n+2}^2=y_{n+2}$$

$$\alpha_{1,0}x_{n+3}+\alpha_{1,1}x_{n+2}+\alpha_{2,1}x_{n+3}^2=y_{n+3}$$

$$\alpha_{1,0}x_n + \alpha_{1,1}x_{n-1} + \alpha_{2,1}x_n^2 = y_n$$

$$\alpha_{1,0}x_{n+1} + \alpha_{1,1}x_n + \alpha_{2,1}x_{n+1}^2 = y_{n+1}$$

FIG. 3 shows a calibration using an LMS algorithm in accordance with one example. The calibration unit 130 (e.g. a non-linear equalizer) may adapt the coefficients ($\alpha_{1,0}$, $\alpha_{1,1}$, $\alpha_{2,1}$) using an LMS algorithm based on the difference between an output of the calibration unit 130 and the output of the second ADC 120 as follows:

$$\alpha_{1,0} \leftarrow \alpha_{1,0} + \mu e_k x_n; \; \alpha_{1,1} \leftarrow \alpha_{1,1} + \mu e_k x_{n-1}; \; \alpha_{2,1} \leftarrow \alpha_{2,1} + \mu e_k x_n^2, \quad \text{Equation(2)}$$

where μ is a step size for LMS adaptation, and $e_k$ is an error between the output of the calibration unit 130 and the output of the second ADC 120. This adaptation procedure is performed iteratively for updating the coefficients based on the output of the second ADC 120.

The calibration unit 130 is configured to find the coefficients ($\alpha_{1,0}$, $\alpha_{1,1}$, $\alpha_{2,1}$ in this example) that makes the equalizer output $y_n$ as close as possible to the input signal $r_n$. At the beginning, the alpha coefficients ($\alpha_{1,0}$, $\alpha_{1,1}$, $\alpha_{2,1}$ in this example) may be initialized to some value (e.g. zeros), and the equalizer output $y_0$ would be in general different from the desired value $r_0$. At each step of the iterative adaptation process, the output from the second ADC 120 is compared to the corresponding output from the calibration unit 130, which is selected by the sample selector 132, and the coefficients ($\alpha_{1,0}$, $\alpha_{1,1}$, $\alpha_{2,1}$ in this example) are updated based on the error signal, as shown in Equation (2) as an example.

When the system is calibrated, the equalizer output $y_n$ will follow the input signal $r_n$. The input signal $r_n$ is observed by the second ADC 120, and the observed signal is used as a reference for adaptation of the calibration unit 130. In case of a periodic input signal with a period Fs/N or integer multiple thereof, the sampling phase of the second ADC 120 (and the corresponding outputs from the calibration unit 130 which is selected by the sample selector 132) is randomized.

Figure 4A:
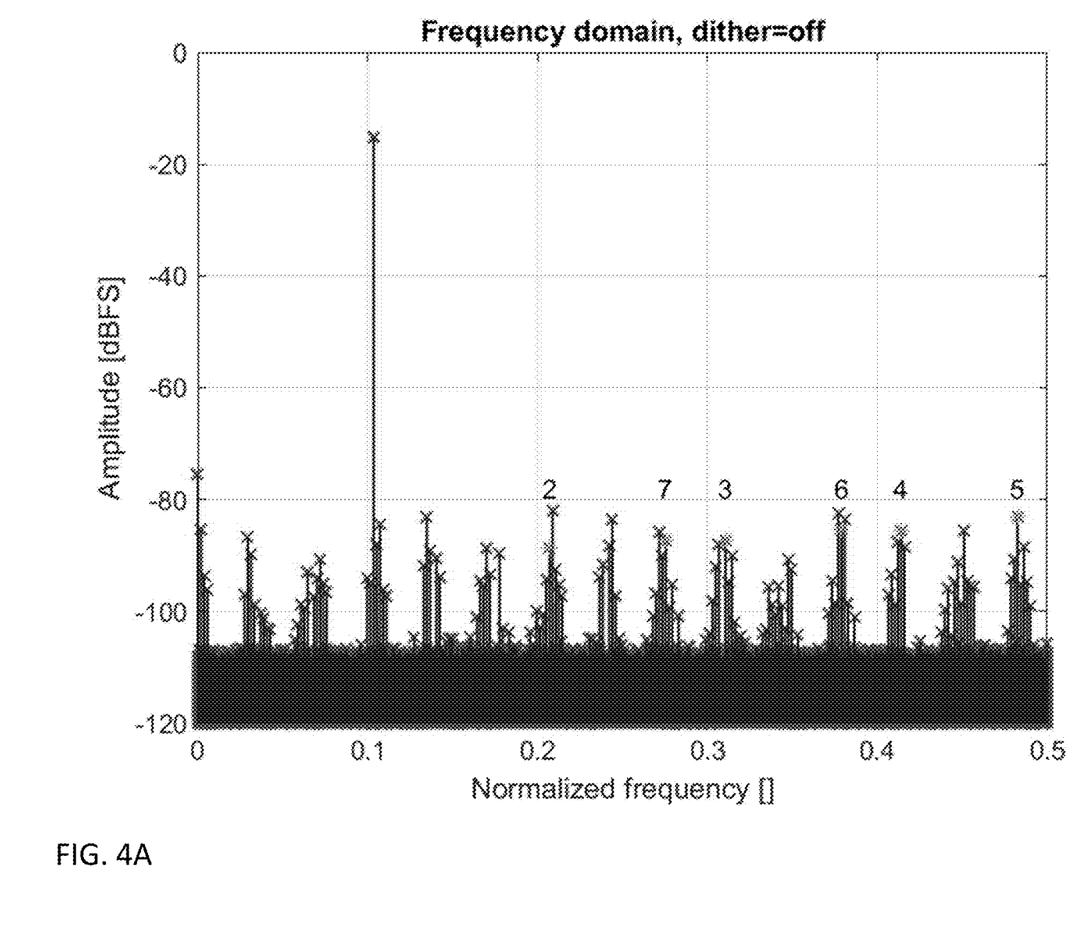
FIG. 4A shows an SFDR without random dithering noise.
Figure 4B:
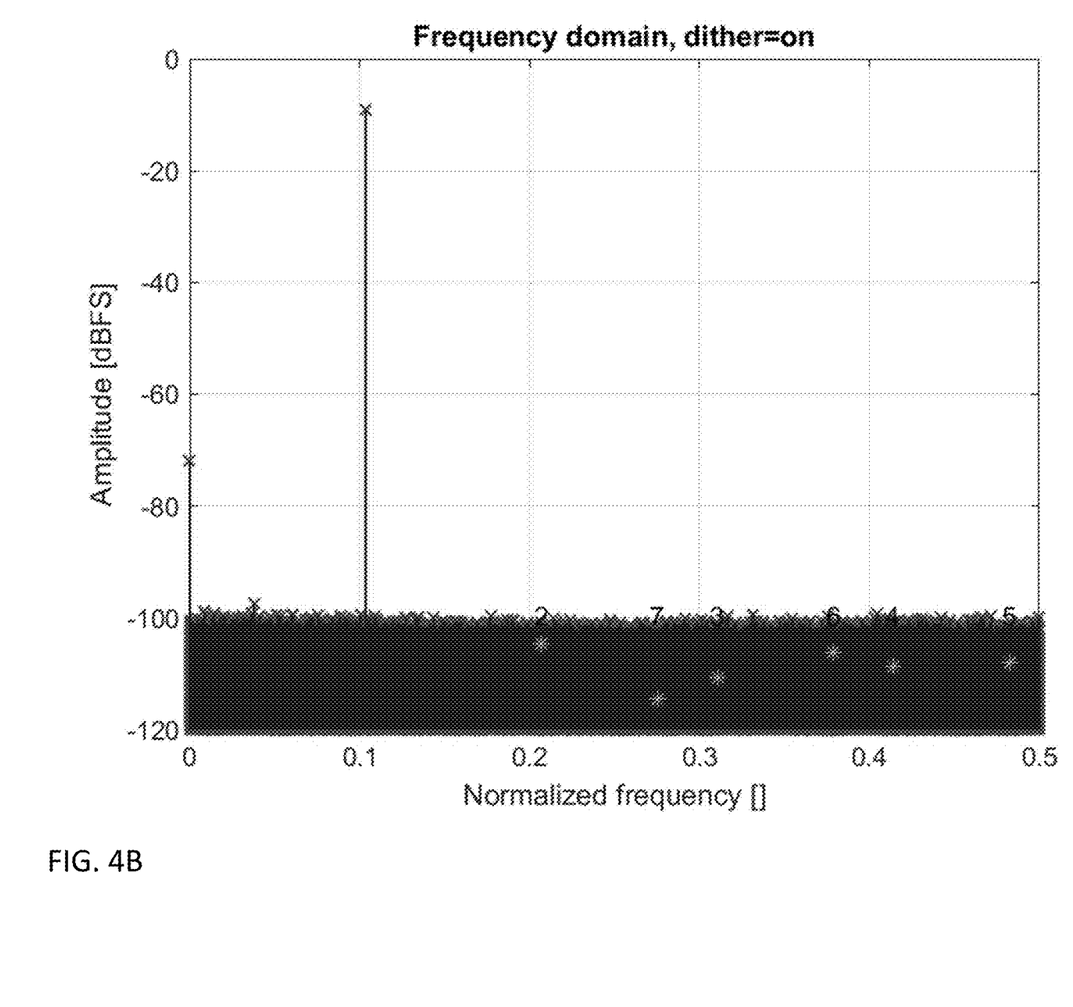
FIG. 4B shows an SFDR with random dithering noise.

Referring to FIG. 2, in some examples, in order to obtain a good SFDR, an additive dithering noise may be added by an adder 116 to the input analog signal 102. A dithering noise is an intentionally applied noise to randomize quantization errors. The dithering noise may be added at an input of the second ADC 120. FIG. 4A shows an SFDR without random dithering noise and FIG. 4B shows an SFDR with random dithering noise (e.g. 6 bit). FIG. 4B shows substantial reduction of quantization spurs. In some examples, the dithering noise may optionally be subtracted by a subtractor 124 at an output of the second ADC 120 in a digital domain. The additive dithering noise can be almost perfectly subtracted after calibration. Alternatively, for simplicity, it is also possible to tolerate the additive dithering noise, as an impact of the noise is greatly reduced after integration in the tap adaptation algorithm.

Figure 5:
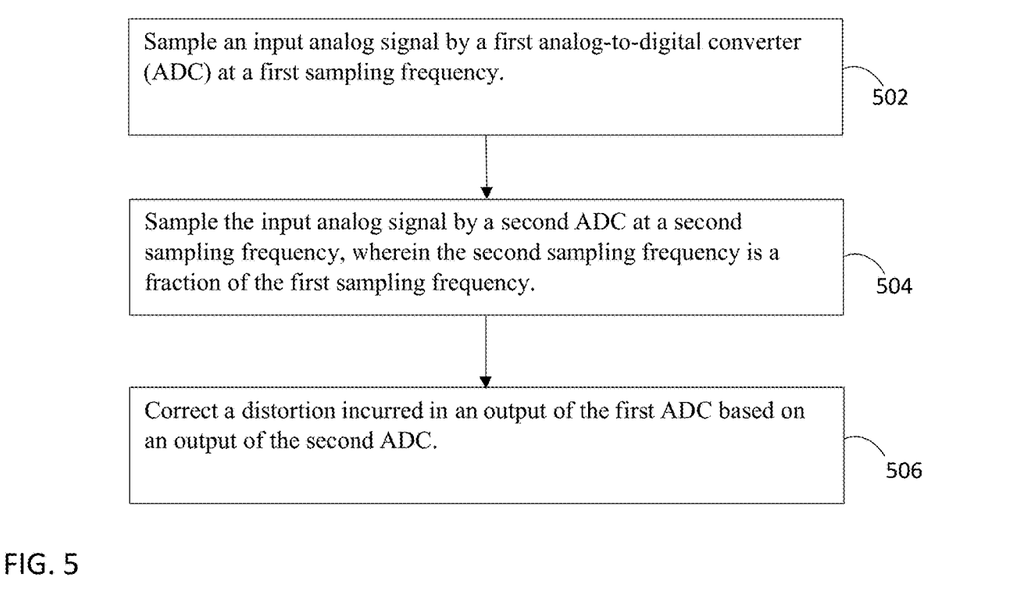
FIG. 5 is a flow diagram of an example process of analog-to-digital conversion in accordance with one example.

FIG. 5 is a flow diagram of an example process of analog-to-digital conversion in accordance with one example. An input analog signal 102 is sampled by a first ADC 110 at a first sampling frequency (502) The input analog signal 102 is sampled by a second ADC 120 at a second sampling frequency (504). The second sampling frequency is a fraction of the first sampling frequency. A distortion incurred in an output of the first ADC 110 is corrected based on an output of the second ADC 120 (506). The distortion may be caused by at least one of static mismatch of normally equal circuit elements, gain mismatch, timing skew, frequency response mismatch, frequency response flatness, buffer non-linearity, sampler non-linearity, or sampler non-linearity mismatch. The distortion may be corrected using a non-linear equalizer implementing a least square or least mean square algorithm.

The first ADC may be a time-interleaved ADC including a plurality of sub-ADCs coupled in parallel. The second ADC may be a sub-ADC (e.g. an extra sub-ADC) of the time-interleaved ADC. The input analog signal may be sampled by the second ADC at random sampling phases. The input analog signal may be buffered by a buffer before being supplied to the second ADC, and the power of the input analog signal may be attenuated at an input of the buffer. A dithering noise may be added to the input analog signal before being supplied to the second ADC. In some example, the dithering noise may then be subtracted from the output of the second ADC in a digital domain.

Figure 6:
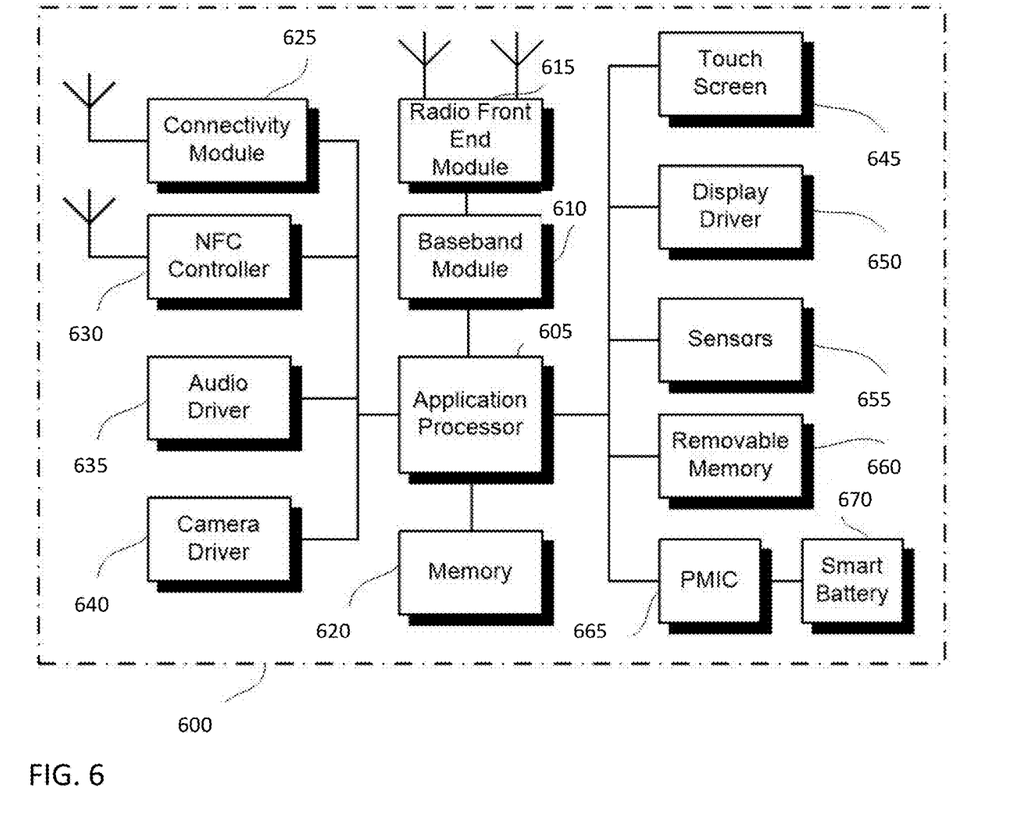
FIG. 6 illustrates a user device in which the examples disclosed herein may be implemented.

FIG. 6 illustrates a user device 600 in which the examples disclosed herein may be implemented. For example, the examples disclosed herein may be implemented in the radio front-end module 615, in the baseband module 610, etc. The user device 600 may be a mobile device in some aspects and includes an application processor 605, baseband processor 610 (also referred to as a baseband module), radio front end module (RFEM) 615, memory 620, connectivity module 625, near field communication (NFC) controller 630, audio driver 635, camera driver 640, touch screen 645, display driver 650, sensors 655, removable memory 660, power management integrated circuit (PMIC) 665 and smart battery 670.

In some aspects, application processor 605 may include, for example, one or more CPU cores and one or more of cache memory, low drop-out voltage regulators (LDOs), interrupt controllers, serial interfaces such as serial peripheral interface (SPI), inter-integrated circuit (I²C) or universal programmable serial interface module, real time clock (RTC), timer-counters including interval and watchdog timers, general purpose input-output (TO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 610 may be implemented, for example, as a solder-down substrate including one or more integrated circuits, a single packaged integrated circuit soldered to a main circuit board, and/or a multi-chip module containing two or more integrated circuits.

Figure 7:
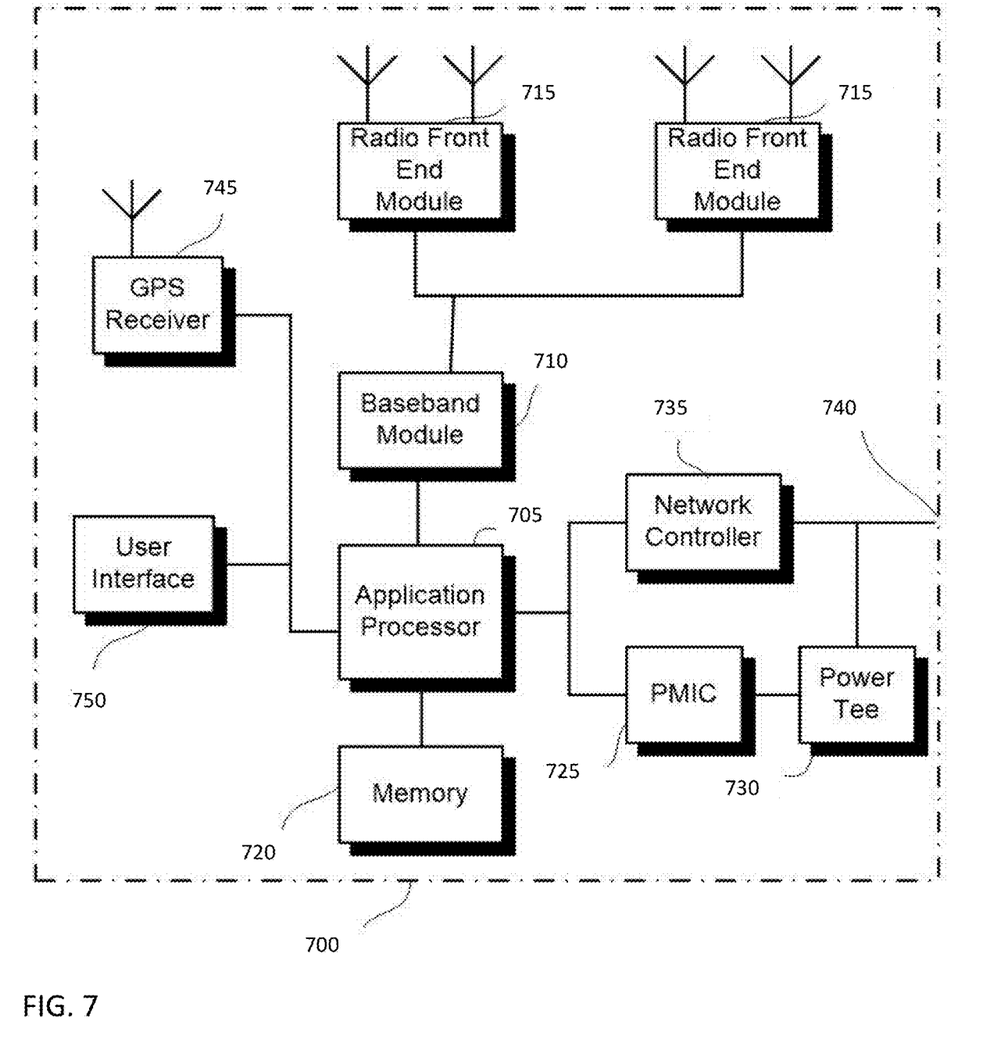
FIG. 7 illustrates a base station or infrastructure equipment radio head in which the examples disclosed herein may be implemented.

FIG. 7 illustrates a base station or infrastructure equipment radio head 700 in which the examples disclosed herein may be implemented. For example, the examples disclosed herein may be implemented in the radio front-end module 715, in the baseband module 710, etc. The base station radio head 700 may include one or more of application processor 705, baseband modules 710, one or more radio front end modules 715, memory 720, power management circuitry 725, power tee circuitry 730, network controller 735, network interface connector 740, satellite navigation receiver module 745, and user interface 750.

In some aspects, application processor 705 may include one or more CPU cores and one or more of cache memory, low drop-out voltage regulators (LDOs), interrupt controllers, serial interfaces such as SPI, I²C or universal programmable serial interface module, real time clock (RTC), timer-counters including interval and watchdog timers, general purpose TO, memory card controllers such as SD/MMC or similar, USB interfaces, MIPI interfaces and Joint Test Access Group (JTAG) test access ports.

In some aspects, baseband processor 710 may be implemented, for example, as a solder-down substrate including one or more integrated circuits, a single packaged integrated circuit soldered to a main circuit board or a multi-chip module containing two or more integrated circuits.

In some aspects, memory 720 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magneto resistive random access memory (MRAM) and/or a three-dimensional crosspoint memory. Memory 720 may be implemented as one or more of solder down packaged integrated circuits, socketed memory modules and plug-in memory cards.

In some aspects, power management integrated circuitry 725 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 730 may provide for electrical power drawn from a network cable to provide both power supply and data connectivity to the base station radio head 700 using a single cable.

In some aspects, network controller 735 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 745 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 745 may provide data to application processor 705 which may include one or more of position data or time data. Application processor 705 may use time data to synchronize operations with other radio base stations.

In some aspects, user interface 750 may include one or more of physical or virtual buttons, such as a reset button, one or more indicators such as light emitting diodes (LEDs) and a display screen.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows:

Example 1 is an apparatus for analog-to-digital conversion. The apparatus includes a first ADC configured to sample an input analog signal at a first sampling frequency, a second ADC configured to sample the input analog signal at a second sampling frequency, wherein the second sampling frequency is a fraction of the first sampling frequency, and a calibration unit configured to correct a distortion incurred in an output of the first ADC based on an output of the second ADC.

Example 2 is the apparatus of example 1, wherein the first ADC is a time-interleaved ADC including a plurality of sub-ADCs coupled in parallel.

Example 3 is the apparatus as in any one of examples 1-2, wherein the second ADC is a sub-ADC of the time-interleaved ADC.

Example 4 is the apparatus as in any one of examples 1-3, wherein the calibration unit is configured to correct the distortion caused by at least one of static mismatch of circuit elements, gain mismatch, timing skew, frequency response mismatch, frequency response flatness, buffer non-linearity, sampler non-linearity, or sampler non-linearity mismatch.

Example 5 is the apparatus as in any one of examples 1-4, wherein the second ADC is configured to sample the input analog signal at random sampling phases.

Example 6 is the apparatus as in any one of examples 1-5, further comprising a buffer for buffering the input analog signal before supplying the input analog signal to the second ADC and an attenuator for attenuating a power of the input analog signal at an input of the buffer.

Example 7 is the apparatus as in any one of examples 1-6, further including an adder for adding a dithering noise to the input analog signal before being supplied to the second ADC.

Example 8 is the apparatus of example 7, further comprising a subtractor for subtracting the dithering noise from an output of the second ADC in a digital domain.

Example 9 is the apparatus as in any one of examples 1-8, wherein the calibration unit is a non-linear equalizer.

Example 10 is the apparatus of example 9, wherein parameters of the non-linear equalizer are adjusted using a least square or least mean square algorithm based on a difference between an output of the non-linear equalizer and the output of the second ADC.

Example 11 is a method for analog-to-digital conversion. The method includes sampling an input analog signal by a first ADC at a first sampling frequency, sampling the input analog signal by a second ADC at a second sampling frequency, wherein the second sampling frequency is a fraction of the first sampling frequency, and correcting a distortion incurred in an output of the first ADC based on an output of the second ADC.

Example 12 is the method of example 11, wherein the first ADC is a time-interleaved ADC including a plurality of sub-ADCs coupled in parallel.

Example 13 is the method of example 12, wherein the second ADC is a sub-ADC of the time-interleaved ADC.

Example 14 is the method as in any one of examples 11-13, wherein the distortion is caused by at least one of static mismatch of circuit elements, gain mismatch, timing skew, frequency response mismatch, frequency response flatness, buffer non-linearity, sampler non-linearity, or sampler non-linearity mismatch.

Example 15 is the method as in any one of examples 11-14, wherein the input analog signal is sampled by the second ADC at random sampling phases.

Example 16 is the method as in any one of examples 11-15, further comprising buffering by a buffer the input analog signal before supplying the input analog signal to the second ADC; and attenuating a power of the input analog signal at an input of the buffer.

Example 17 is the method as in any one of examples 11-16, further comprising adding a dithering noise to the input analog signal before being supplied to the second ADC.

Example 18 is the method of example 17, further comprising subtracting the dithering noise from an output of the second ADC in a digital domain.

Example 19 is the method as in any one of examples 11-18, wherein the distortion is corrected using a non-linear equalizer implementing a least square or least mean square algorithm.

Example 20 is a non-transitory machine-readable storage medium including codes, when executed, to cause a machine to perform a method as in any one of examples 11-19.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

The invention claimed is:

1. An apparatus for analog-to-digital conversion, comprising:
    a first analog-to-digital converter (ADC) configured to sample an input analog signal at a first sampling frequency;
    a second ADC configured to sample the input analog signal at a second sampling frequency, wherein the second sampling frequency is a fraction of the first sampling frequency; and
    a calibration unit configured to correct a distortion incurred in an output of the first ADC based on an output of the second ADC,
    wherein the calibration unit is a non-linear equalizer,
    wherein parameters of the non-linear equalizer are adjusted using a least square or least mean square algorithm based on a difference between an output of the non-linear equalizer and the output of the second ADC.

2. The apparatus of claim 1, wherein the first ADC is a time-interleaved ADC including a plurality of sub-ADCs coupled in parallel.

3. The apparatus of claim 2, wherein the second ADC is a sub-ADC of the time-interleaved ADC.

4. The apparatus of claim 2, wherein the calibration unit is configured to correct the distortion caused by at least one of static mismatch of circuit elements, gain mismatch, timing skew, frequency response mismatch, frequency response flatness, buffer non-linearity, sampler non-linearity, or sampler non-linearity mismatch.

5. The apparatus of claim 1, wherein the second ADC is configured to sample the input analog signal at random sampling phases.

6. The apparatus of claim 1, further comprising a buffer for buffering the input analog signal before supplying the input analog signal to the second ADC and an attenuator for attenuating a power of the input analog signal at an input of the buffer.

7. The apparatus of claim 1, further comprising:
an adder for adding a dithering noise to the input analog signal before being supplied to the second ADC.

8. The apparatus of claim 7, further comprising:
a subtractor for subtracting the dithering noise from an output of the second ADC in a digital domain.

9. A method for analog-to-digital conversion, comprising:
sampling an input analog signal by a first analog-to-digital converter (ADC) at a first sampling frequency;
sampling the input analog signal by a second ADC at a second sampling frequency, wherein the second sampling frequency is a fraction of the first sampling frequency; and
correcting a distortion incurred in an output of the first ADC based on an output of the second ADC,
wherein the distortion is corrected using a non-linear equalizer implementing a least square or least mean square algorithm.

10. The method of claim 9, wherein the first ADC is a time-interleaved ADC including a plurality of sub-ADCs coupled in parallel.

11. The method of claim 10, wherein the second ADC is a sub-ADC of the time-interleaved ADC.

12. The method of claim 10, wherein the distortion is caused by at least one of static mismatch of circuit elements, gain mismatch, timing skew, frequency response mismatch, frequency response flatness, buffer non-linearity, sampler non-linearity, or sampler non-linearity mismatch.

13. The method of claim 9, wherein the input analog signal is sampled by the second ADC at random sampling phases.

14. The method of claim 9, further comprising:
buffering by a buffer the input analog signal before supplying the input analog signal to the second ADC; and
attenuating a power of the input analog signal at an input of the buffer.

15. The method of claim 9, further comprising:
adding a dithering noise to the input analog signal before being supplied to the second ADC.

16. The method of claim 15, further comprising:
subtracting the dithering noise from an output of the second ADC in a digital domain.

17. A non-transitory machine-readable storage medium including codes, when executed, to cause a machine to perform a method of claim 9.

* * * * *